United States Patent [19]

Chiyoma et al.

[11] Patent Number: 4,679,088
[45] Date of Patent: Jul. 7, 1987

[54] IMAGE SENSOR WITH MEANS TO ADJUST CAPACITANCE OF SIGNAL LEADS

[75] Inventors: Hitoshi Chiyoma, Okegawa; Zensaku Watanabe, Yokohama; Masahiro Nakagawa, Chofu, all of Japan

[73] Assignee: Kabushiki Kaisha Toshiba, Kawasaki, Japan

[21] Appl. No.: 802,160

[22] Filed: Nov. 25, 1985

[30] Foreign Application Priority Data

Nov. 28, 1984 [JP] Japan .................................. 59-250879
Jun. 25, 1985 [JP] Japan .................................. 60-136991

[51] Int. Cl.$^4$ ........................................... H04N 1/024
[52] U.S. Cl. ............................ 358/213.18; 358/294; 250/578
[58] Field of Search ..................... 358/213, 212, 294; 250/578

[56] References Cited

U.S. PATENT DOCUMENTS

| | | | |
|---|---|---|---|
| 3,668,408 | 6/1972 | Yamashita et al. | 250/578 |
| 4,365,274 | 12/1982 | Takenouchi et al. | 358/213 |
| 4,453,187 | 6/1984 | Komiya et al. | 358/213 |
| 4,482,804 | 11/1984 | Oritsuki et al. | 358/213 |
| 4,486,778 | 12/1984 | Risch et al. | 358/213 |
| 4,546,243 | 10/1985 | Hamano et al. | 250/578 |
| 4,565,928 | 1/1986 | Yamamoto et al. | 358/213 |

FOREIGN PATENT DOCUMENTS 58-24266A 2/1983 Japan .................................. 358/294

OTHER PUBLICATIONS

Japanese Journal of Applied Physics, vol. 2 (1982) Supplement 21-1, pp-245-249, An Amorphous Si High Speed Linear Image Sensor, T. Hamamo et al.

Primary Examiner—Gene Z. Rubinson
Assistant Examiner—Stephen Brinich
Attorney, Agent, or Firm—Oblon, Fisher, Spivak, McClelland & Maier

[57] ABSTRACT

Image sensor wherein there are provided a charge storage type photoelectric conversion section and a drive circuit including an integrated circuit on a substrate, and with these being connected by conductive strips, characterized in that capacitance adjustment conductive strips extend from the drive circuit section, and are arranged so as to pass underneath or close to the photoelectric conversion section and reduce variations in stray capacitances in the conductive strips.

16 Claims, 14 Drawing Figures

IMAGE SENSOR WITH MEANS TO ADJUST CAPACITANCE OF SIGNAL LEADS

BACKGROUND OF THE INVENTION

1. Field of the invention

This invention relates to an image sensor which converts images from the image surface of documents, etc., into electrical signals using an array of photoelectric conversion elements, more particularly to a charge storage type of contact image sensor.

2. Background of the prior art

In order to reduce in size of image reading equipment which is used in facsimile machines, etc., contact image sensors are used. These contact image sensors are ones which read the image data at a size of almost 1:1, and signal reading, particularly in charge storage contact image sensors, is carried out by a voltage reading method.

The basic configuration of this type of image sensor is shown in FIG. 9.

In this FIG., P is a charge storage type of photoelectric conversion element made from photodiode D which puts out an electric charge according to the interelectrode capacitance $C_0$ and the amount of incident light, and is normally arranged in an array.

One end of each of these photoelectric conversion elements P is connected to drive power source E, and the other ends are each connected to switching element S of integrated circuit I through conductive strips L. Switching elements S are driven in order by shift register SR, and the charge signal storaged by photoelectric conversion element P is output.

A switching element S becomes ON in sequence, and during the time until reading one line is complete and it becomes ON once more, the charge produced by photoelectric conversion element accumulates in inter-terminal capacitance $C_0$, and when the switching element S which corresponds to that accumulated charge becomes ON, it is read out. This charge which is read out passes through a detecting circuit and is output as read output.

However, in this type of existing image sensor, photoelectric conversion element P and integrated circuit I are connected by conductive strips L formed on the substrate as dedscribed above, but the lengths of these conductive strips L on the integrated circuit mounting are not standardized, and since the wiring capacitance of each of the conductive strips is non-uniform, there is the problem that distortions are produced in the output signal.

The conductive strips have two wiring capacitances, ground capacity $C_1$, and wiring stray capacitances $C_2$ (stray capacitances of the conductive strips defining wiring patterns), and if the remaining capacitance produced by integrated circuit I is taken as $C_3$, and the charge which is storaged in photoelectric conversion element P is taken as Q, then with a voltage reading method, the photoelectric conversion element output signal at the end of the wiring pattern is given by formula (1), and the photoelectric conversion element output signal for other sections is given by formula (2).

$$Q/(C_0+C_1+C_2+C_3) \quad (1)$$

$$Q/(C_0+C_1+2C_2+C_3) \quad (2)$$

Consequently, when the conductive strips L become long or high density, variations in wiring capacitance $(C_1+C_2)$ increase, there is an accompanying increase in variations in the output signal, so that for example, as shown in FIG. 10, when marks, such as black mark $1a$ and lighter mark $1b$, are read by image sensor 2 the output signal from each photoelectric conversion element P is not standardized, and as shown in FIG. 11, distortions are produced in the output. For this reason, if the output signal is normally read as "1" or "0", a threshold level SL is taken. However, in color sensing devices, etc., since detection of gray scale lightness is necessary, then, as shown in FIG. 12, for example, 2 threshold levels have to be taken, and because of this, output signals need to be corrected as shown in FIG. 13 using output correction circuits. However, adding this type of correction circuit gives rise to the problems of complicating the image sensor construction and increasing product costs.

As a means of correcting this sort of output variation, as shown in FIG. 14, a method has been proposed of evening out variations in wiring capacitance $(C_1+C_2)$ and adjusting ground capacity $C_1$ by changing the conductive strips L of integrated circuit I so that their width decreases in proportion with their length. In this drawing T is a photoelectric conversion element connection terminal, and W is bonding wire.

However, even though this method corrects conductive strip ground capacity $C_1$ by having the normal photoelectric conversion element array pitch equal, there is the problem that because the spaces between adjacent conductive strips are not equal, the wiring stray capacitance $C_2$, which is one of the stray capacitances, is non-uniform. The inventors also attempted to consider a method of correcting non-uniformity of stray capacitances in conductive strips L, produced by differences in wiring length, by changing interterminal capacitance $C_0$ of photoelectric conversion element P. This is not shown in the diagram. However, since in comparison with conductive strip L stray capacitances $C_1$, $C_2$, for a low resolution image sensor of 1-4 dots/mm, inter-terminal capacitance $C_0$ is large, then correction changes greatly according to fluctuations in the photoetching process, that is to say, according to changes in photoetching conditions, etc. For this reason, the sum of this capacitance and the stray capacitances could not be standardized, the degree of improvement in image sensor output current uniformity was samll, and the method could not be put into practical use. In addition, for a high resolution image sensor of 8 dots/mm or higher, since stray capacitances $C_1$, $C_2$ in conductive strips L become larger than inter-terminal capacitance $C_0$, in addition to correction only having a small effort, conversely, when the length (in the sub-scanning direction) of the terminal which determines photoelectric conversion element inter-terminal capacitance $C_0$ is substantially changed to increase $C_0$, then the sub-scanning direction reading position varies between photoelectric conversion elements, and because of this, there are problems in application with regard to reading accuracy. Furthermore, in addition to correcting the wiring capacitances, the size of the conductive strips increases, causing an increase in the size of the image sensor.

SUMMARY OF THE INVENTION

An object of this invention is to overcome the disadvantages of the conventional type. A further object of this invention is to provide an image sensor with good productivity which is capable of correcting variations in output signals produced by capacitance distortions in conductive strips, etc., and without increasing in size.

In order to achieve the aim described above, the essential features of the image sensor in this invention can be briefly described as follows. It is characterized in that it has capacitance adjustment conductive strips which correct the non-uniformities in capacitance of connecting conductive strips where at least one part of the wire length formed on the substrate is non-uniform, and in that these capacitance adjustment conductive strips are arranged so as to exist, insulated with an insulating layer, underneath or close to the photoelectric conversion section, as a result to be able to substantially equalize the stray capacitances of the conductive strips.

DETAILED DESCRIPTION OF THE PREFERRED EMBODIMENT

Figure 1:
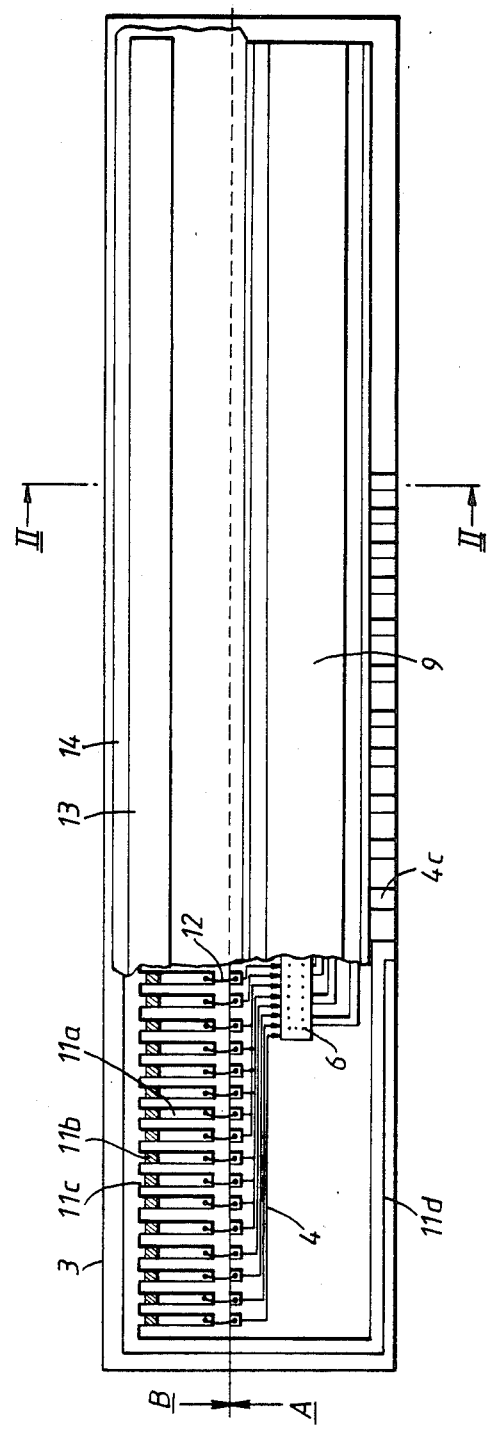
FIG. 1 is a planar view of an embodiment of the invention with one section cut away.
Figure 2:
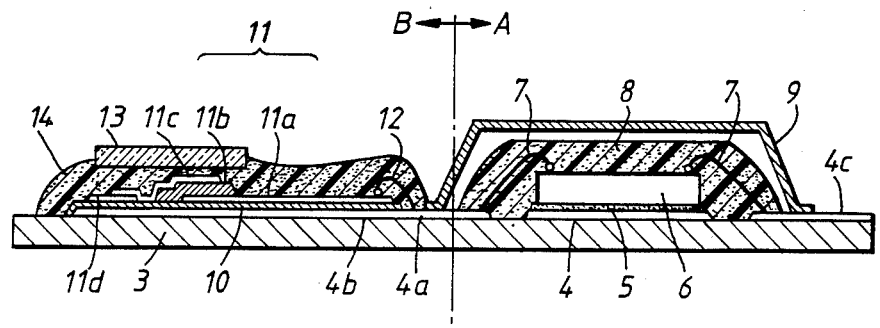
FIG. 2 is a sectional view shown in FIG. 1 taken along line II—II.
Figure 3:
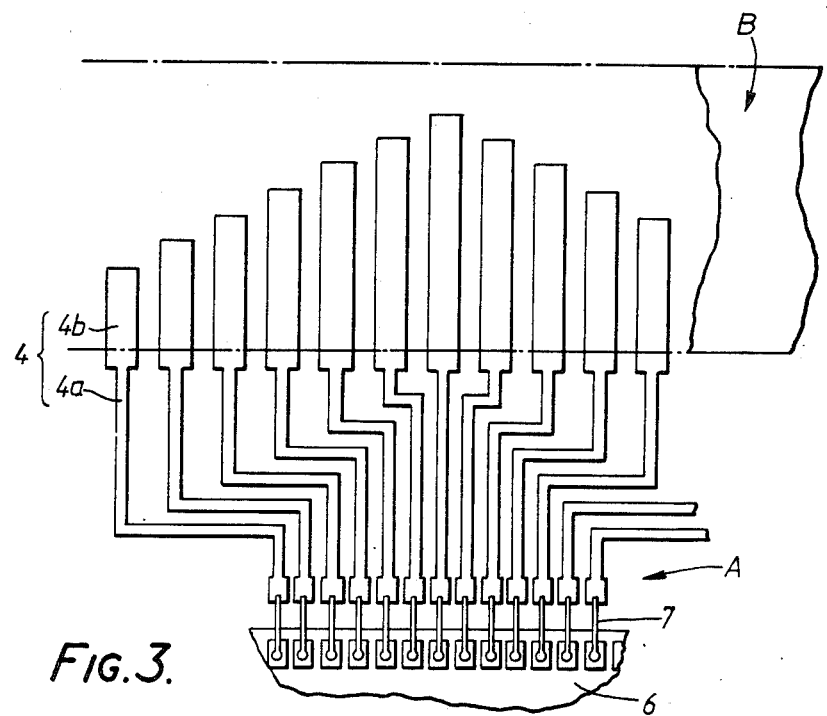
FIG. 3 is a planar view of the wiring pattern in the embodiment in FIG. 1

An embodiment of the invention will be described with reference to the drawings. FIGS. 1-3 show an embodiment of the invention. This image sensor is made up from a drive circuit section A and a photoelectric conversion section B.

The main sections which make up drive circuit section A are conductive strips 4, made from thin films, 0.8-1.4 μm thick, of aluminum, gold or Cu/Pd/Au formed on a rectangular alumina ceramic substrate 3, and an integrated circuit 6 having an analog switch function which is fixed onto conductive strips 4 by conductive epoxy resin 5.

Conductive strips 4 comprise connecting conductive strips 4a, and capacitance adjustment conductive strips 4b. Connecting conductive strips 4a, in the same way as existing conductive strips, are formed with a uniform width, e.g. 70-100 μm, and with separation, distance 100 μm-1 mm, but non-uniform length, with longer strips towards the ends due to differences in the dimensions of photoelectric conversion section B and integrated circuit 6. Capacitance adjustment conductive strips 4b, largely arranged in the area of photoelectric conversion section B on substrate 3, are each connected to connecting conductive strips 4a, and are made so that their area reduces in proportion to the increase in length of the connecting conductive strips to which they are connected. They are formed from conductive strips that are wider, e.g. 700-800 μm width, than the connecting conducting strips and adjusted so that the sums of the areas of the connecting conductive strip 4a and capacitance adjustment conductive strip 4b are virtually equal. The one ends of the capacitance adjustment conductive strips 4b are open. Thus, as described below, the structure is such that the wide section, protruding from area B at the edge of drive circuit section A area on the substrate, doubles as a connecting pad for a photoelectric conversion element terminal. Integrated circuit 6 is electrically connected to connecting conductive strips 4a by gold or aluminium wire 7. Photoelectric conversion section B insulating layer 10 (e.g. polyimide as passivation layer, vitreous non-organic substance) is formed on top of capacitance adjusting conductive strips 4b by spin coating or screen printing methods, etc., and photoelectric conversion section B is formed on top of this by thin film or thick film technology. The connected conductive strip connecting terminals from the integrated circuit are covered by potting using an insulating resin, and the outside is covered by protective cap 9.

Photoelectric conversion section B, arranged along the longest dimension of substrate 3, is formed from insulating layer 10 and photoelectric conversion element 11, made from separate electrodes 11a which are formed on insulating layer 10 using a chrome or aluminium thin film, high resistance photoconductive layers 11b which are formed on these separate electrodes 11a by applying e.g. a-Si:H sequentially, and transparent electrodes 11c of $SnO_2$, ITO, etc. Bonding pads are formed on each of the separate electrode 11a conductive strips of photoelectric conversion element 11 by applying a thin film of either gold or aluminium, and connection to connecting conductive strips 4a is made by gold or aluminium wires 12, which are bonded to the ends of capacitance adjustment conductive strips which double as connecting pads. 11d is a common electrode to give electrical continuity to drive power source E and output from transparent electrode 11c which is opposite separate electrode 11a in photoelectric conversion element P.

Next, a transparent glass plate 13 is fixed on top of photoelectric conversion element 11 with a transparent insulating resin 14, and its surroundings are bonded as far as protective cap 9 by the same resin.

In the image sensor in this embodiment, the output signals from the photoelectric conversion elements are conducted through gold or aluminium wires 12, connecting conductive strips 4a, and gold or aluminium wire 7 to integrated circuit 6.

In the image sensor in this embodiment, because conductive strips 4 extend underneath or close to photoelectric conversion section B so that their areas become equal, correcting wiring capacitances can be carried out perfectly without greatly increasing the size. It goes without saying that it is enough for the conductive strips to be extended underneath or close to photoelectric conversion section B in only one direction.

Figure 4:
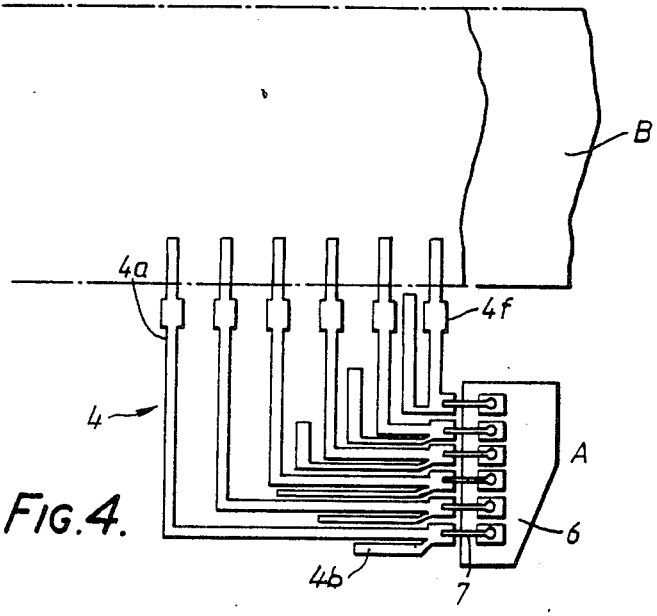
FIG. 4 is a planar view of the main parts of another embodiment of the invention.

FIG. 4 is a sectional view of another embodiment of the invention. In the description below, sections in common with FIG. 1 are allocated the same symbols and repetitive descriptions are omitted.

In this embodiment, in addition to being formed in an L-shape, each connecting conductive strip 4a corresponding to an individual photoelectric conversion element is formed so as to have point symmetry with the capacitance adjustment conductive strips connected through connecting pads 4f which are arranged along photoelectric conversion section B at the boundary of drive circuit section A area on the substrate. The sum of the conductive strip lengths where there is the same gap between adjacent strips is the same for all conductive strips 4, and because of this, the ground capacity $C_1$ and stray wiring capacitance $C_2$ of each of the conductive strips 4 are adjusted so that they are virtually equal. With this structure, design is simple, and correction is easy.

Figure 5:
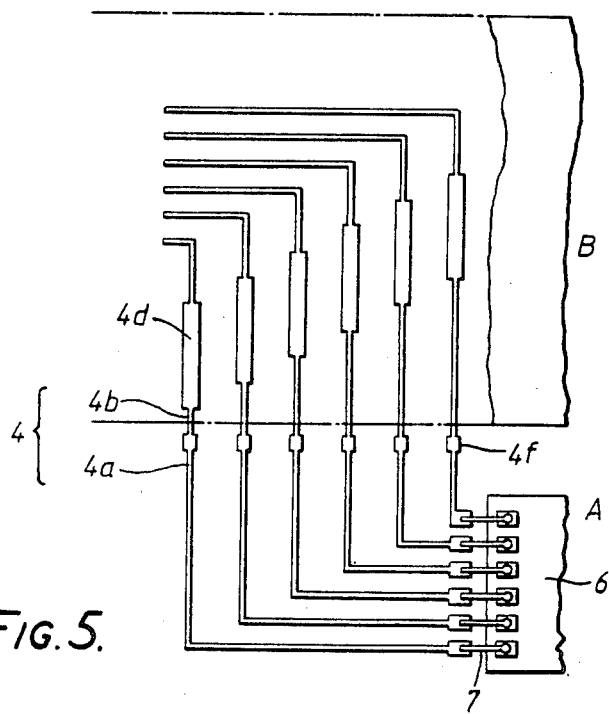
FIG. 5 is a planar view of the main parts of yet another embodiment of this invention.

FIG. 5 is a sectional view of the main parts of a further embodiment of the invention.

In this embodiment, in order to improve uniformity of ground capacity $C_1$ produced by process fluctuations when the conductive strips are being formed according to finish differences in the substrate surface, a wide ground capacity correction strip 4d is added. The wide sections 4d are positioned so that part is in close proximity between each of the strips, the length of the wide sections is fixed, and the total lengths of each of the strips, including the capacitance adjusting conductive film is equal. Because of this, with the proportion of fluctuations in ground capacity of each conductive strip reduced, capacitances between strips can be made substantially equal.

Figure 6:
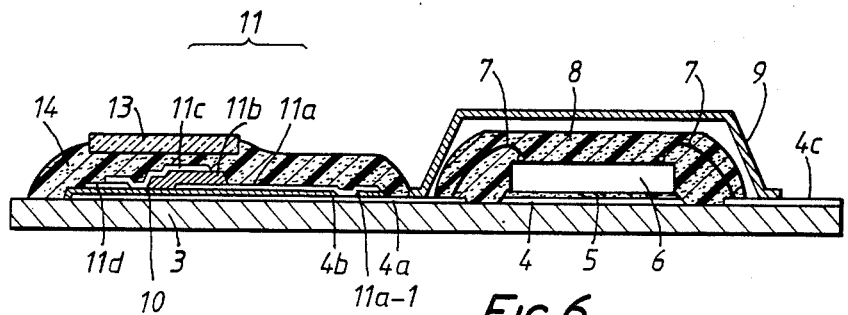
FIG. 6 is a sectional view of another embodiment of the invention.

FIG. 6 is a view of a different embodiment of the invention from the embodiment in FIG. 1. This is an example of an image sensor formed so that the wiring pattern is the same as in the embodiment in FIG. 1, but a through hole has been formed at 11a-1, part of insulating layer 10, and electrical connection of separate electrode 11a of photoelectric conversion element P with connecting conductive strip 4a is made using this through hole. In FIG. 1, the connection is made by wire bonding.

Figure 7:
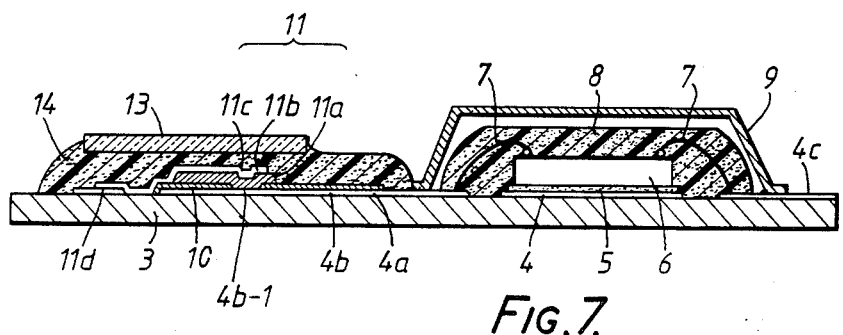
FIG. 7 is a sectional view of another embodiment of the invention.

FIG. 7 shows another embodiment of the invention. The image sensor in this embodiment has through holes formed in insulating layer 10 at the structural section of photoelectric conversion element 11, and takes part 4b-1 of capacitance adjustment conductive strip 4b as separate electrode 11a of photoelectric conversion element 11. The construction is such that correction of stray capacitance distortions is still the same as in the first embodiment (that shown in FIG. 1), and each of the wiring capacitances are virtually equal.

Figure 8:
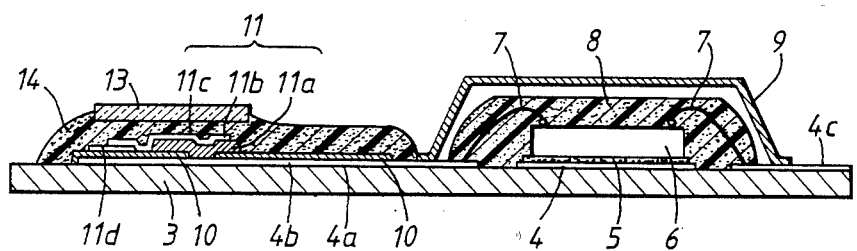
FIG. 8 is a sectional view of yet another embodiment of this invention.
Figure 9:
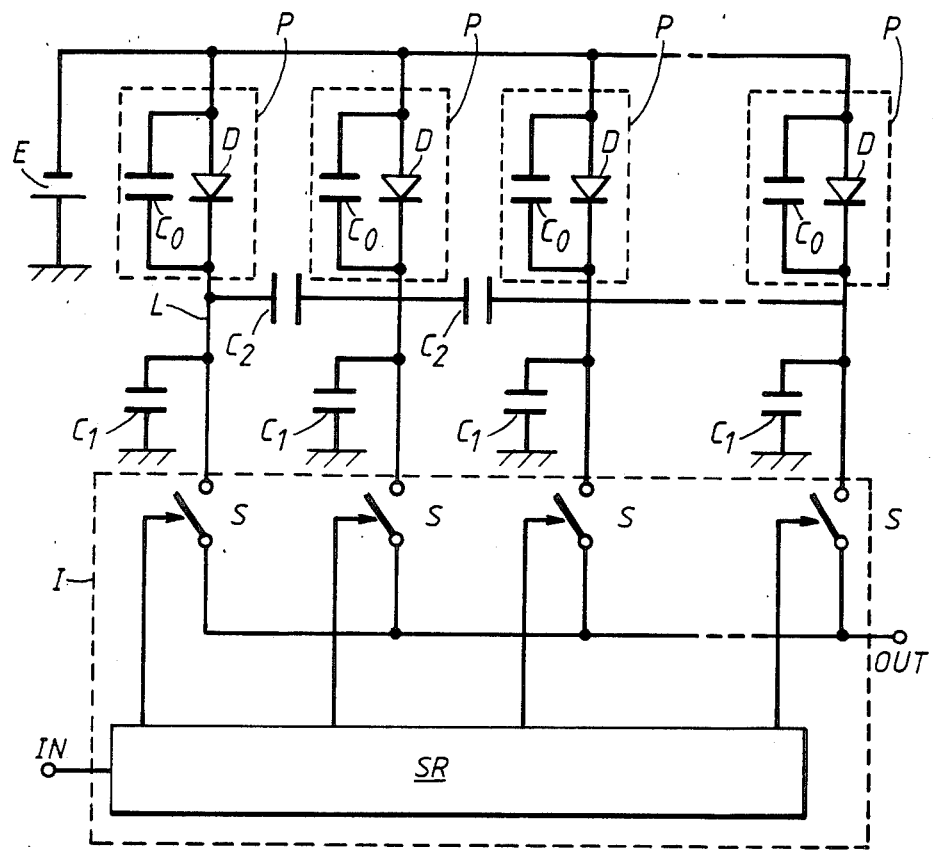
FIG. 9 is an equivalent circuit diagram of an image sensor.
Figure 10:
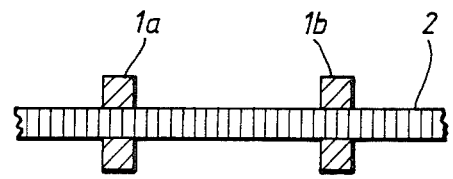
FIG. 10 is a view of the positional relationships between marks to be read and the photoelectric conversion element array.
Figure 11:
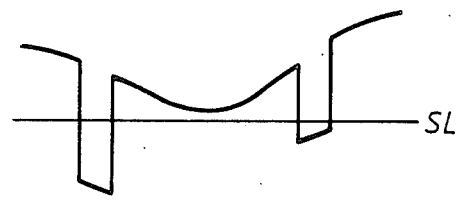
FIG. 11 is a waveform diagram of the output signal produced by the photoelectric conversion element array in FIG. 10.
Figure 12:
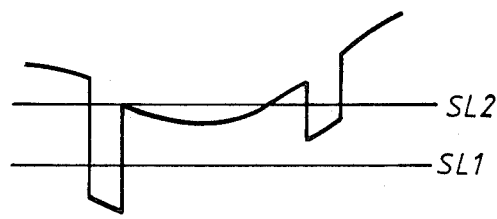
FIG. 12 is another waveform diagram of the output signal produced by the photoelectric conversion element array in FIG. 10.
Figure 13:
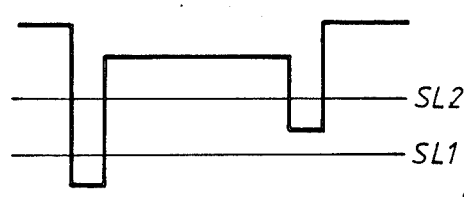
FIG. 13 is a waveform diagram of the waveform in FIG. 12 after correction.
Figure 14:
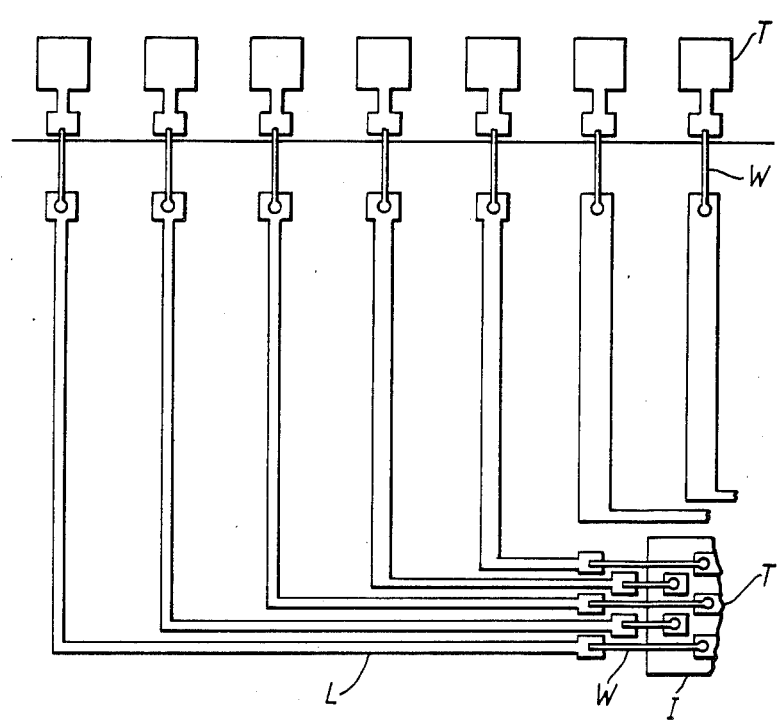
FIG. 14 is a planar view of the main parts of an image sensor in the prior art which eliminates variations in output signals.

FIG. 8 is another embodiment of the invention, with common electrode 11d formed on top of insulating layer 10.

As described above, since the image sensor in this invention is formed from capacitance adjustment conductive strips at least underneath or close to the photoelectric conversion section with an insulating layer and each connected to a connecting conductive strip which links a photoelectric conversion element with an integrated circuit, complete correction of output signal variations, produced by capacitance distortions in the conductive strips, etc., is possible without greatly enlarging the size. Furthermore, by using parts of the capacitance adjustment conductive strips in the wiring pattern as parts of photoelectric conversion elements, the connection points between the photoelectric conversion section and the drive circuit section are greatly reduced, and in addition to improving productivity, a highly reliable image sensor is obtained.

What is claimed is:

1. In an image sensor comprising:
    a substrate;
    a photoelectric conversion section formed from an array of individual photoelectric conversion elements formed on said substrate;
    a drive circuit section reading the output signals from said photoelectric conversion elements; said photoelectric conversion section and said drive circuit section being connected by a plurality of conductive strips of which the wiring length of at least one of the strips formed on said substrate is different from the length of another of the strips, the improvement comprising capacitance adjustment conductive strips which correct the wiring length of at least one of said connecting conductive strips, are positioned underneath or close to said photoelectric conversion section, and equalize substantially the stray capacitance of each of said connecting conductive strips.

2. The image sensor according to claim 1, wherein at least one section of said capacitance adjustment conductive strip forms a part of said photoelectric conversion element.

3. The image sensor according to claim 1, wherein said photoelectric conversion element is a charge storage type photoelectric conversion element.

4. The image sensor according to claim 1, wherein making the stray capacitances of each of said connecting conductive strips uniform is carried out by reducing the area of each of said capacitance adjustment conductive strips by an amount in proportion to the length of each of the said connecting conductive strips.

5. The image sensor according to claim 1, wherein at least one of the wiring length and wiring gap of said capacitance adjustment conductive strips is adjusted in proportion to the length of said connecting conductive strip adjacent to each of said capacitance adjustment conductive strips.

6. The image sensor according to claim 1, wherein at least part of said capacitance adjustment conductive strip is provided with ground capacity correction means.

7. The image sensor according to claim 6, wherein said ground capacity correction means is an ground capacity correction conductive strip wider than said capacitance adjustment conductive strip.

8. In an image sensor comprising:
    a charge storage type photoelectric conversion section comprising a photoelectric conversion element array and first conductive strips connected to the electrodes of said elements;
    a drive circuit section comprising an integrated circuit driving said photoelectric conversion elements and second conductive strips connected to said integrated circuit;
    a substrate on which are formed a photoelectric conversion section area where said photoelectric conversion section is positioned and on which are formed a drive circuit section area where said drive circuit section is positioned;

connection pads set up on said second conductive strips along said drive circuit section area;

a means of connecting said connection pads with said first conductive strips; and capacitance adjustment conductive strips which are extended underneath said photoelectric conversion section and insulated with an insulating layer in said photoelectric conversion section area of said substrate and which are connected to said second conductive strips.

9. The image sensor according to claim 8, wherein said substrate is rectangular and said photoelectric conversion section is arranged longitudinally along said substrate.

10. The image sensor according to claim 8, wherein said capacitance adjustment conductive strips extend from the pad of said second conductive strips and the ends of said capacitance adjustment conductive strips are open.

11. The image sensor according to claim 10, wherein a wide section is formed in either said capacitance adjustment conductive strips or in said second conductive strips or in both.

12. The image sensor according to claim 10, wherein a wide section is mainly formed in said capacitance adjustment conductive strips.

13. The image sensor according to claim 8, wherein the total lengths of said capacitance adjustment conductive strips together with said second conductive strips are equal.

14. The image sensor according to claim 11, wherein a wide sections on at least one of said strips comes close together between said strips.

15. The image sensor according to claim 11, wherein second conductive strips in which the length is short have a wide section elongated.

16. The image sensor according to claim 11, wherein a wide section formed on at least one of said strips doubles as a pad.

* * * * *